United States Patent
Soman

(10) Patent No.: US 8,806,233 B2
(45) Date of Patent: Aug. 12, 2014

(54) POWER DELIVERY NOISE REDUCTION ON A MEMORY CHANNEL

(75) Inventor: Sanjiv C. Soman, Seattle, WA (US)

(73) Assignee: Intel Corporation, Santa Clara, CA (US)

( * ) Notice: Subject to any disclaimer, the term of this patent is extended or adjusted under 35 U.S.C. 154(b) by 833 days.

(21) Appl. No.: 12/971,778

(22) Filed: Dec. 17, 2010

(65) Prior Publication Data

US 2012/0159199 A1 Jun. 21, 2012

(51) Int. Cl.
*G06F 1/26* (2006.01)
*G11C 7/02* (2006.01)

(52) U.S. Cl.
USPC .......................................... 713/300; 365/206

(58) Field of Classification Search
CPC ........ G11C 7/02; G11C 5/147; G11C 7/1048; G11C 7/1057; G06F 1/26
USPC .......................................... 713/300; 365/206
See application file for complete search history.

(56) References Cited

U.S. PATENT DOCUMENTS

| | | | |
|---|---|---|---|
| 2005/0218972 A1* | 10/2005 | Hazucha et al. | 327/551 |
| 2007/0262794 A1* | 11/2007 | Chen | 327/32 |
| 2008/0040624 A1* | 2/2008 | Wilcox | 713/320 |
| 2010/0201397 A1* | 8/2010 | Gillingham | 326/30 |
| 2011/0043220 A1* | 2/2011 | Leibowitz et al. | 324/613 |
| 2011/0127990 A1* | 6/2011 | Wilson et al. | 324/76.44 |

* cited by examiner

*Primary Examiner* — Kim Huynh
*Assistant Examiner* — Brandon Kinsey
(74) *Attorney, Agent, or Firm* — Schwabe, Williamson & Wyatt, P.C.

(57) ABSTRACT

A device, computer system, and method are disclosed. In one embodiment, the device includes a memory buffer driver circuit that can drive signals on a memory channel at a given voltage level. The voltage at the voltage level is supplied to the memory buffer driver circuit from a rail of a power delivery network. The voltage level exhibits a repeatable fluctuation cycle at a resonant frequency of the power delivery network. The device also includes an on-die termination logic circuit that asserts a first termination resistance on the memory channel after the memory channel enters an idle state but before the voltage level reaches a peak of the repeatable fluctuation cycle. The on-die termination logic circuit then deasserts the first termination resistance on the memory channel at a later point in time.

20 Claims, 5 Drawing Sheets

POWER DELIVERY NOISE REDUCTION ON A MEMORY CHANNEL

FIELD OF THE INVENTION

The invention relates to computer memory. Specifically, the invention relates to on-die termination and the effect a computer system's power delivery network resonant frequency has on a memory channel.

BACKGROUND OF THE INVENTION

With data scrambling implemented on most new double data rate (DDR) dynamic random access memory (DRAM) designs, the largest power noise events on a memory channel are now associated with "burst-idle" sequences that approximate the power delivery network resonance frequency. A DDR channel can have bursts in multiples of 4 cycles and any number of idle cycles in between bursts. So for example, a power delivery network with a resonance of 120 Mhz, for a DDR interface running at 1600 MTs (1600 mega-transfers per second), a sequence of 8 active cycles followed by 5 idle cycles results in an effective power delivery network excitation of 123 Mhz which is very close to the power delivery network's resonance. The DDR scrambler can only scramble data during active cycles. However, it cannot prevent these "burst-idle" sequences that match the resonant frequency from happening.

BRIEF DESCRIPTION OF THE DRAWINGS

The present invention is illustrated by way of example and is not limited by the drawings, in which like references indicate similar elements, and in which.

DETAILED DESCRIPTION OF THE INVENTION

Embodiments of a device, computer system, and method to reduce power delivery noise on a memory channel are disclosed.

Figure 1:
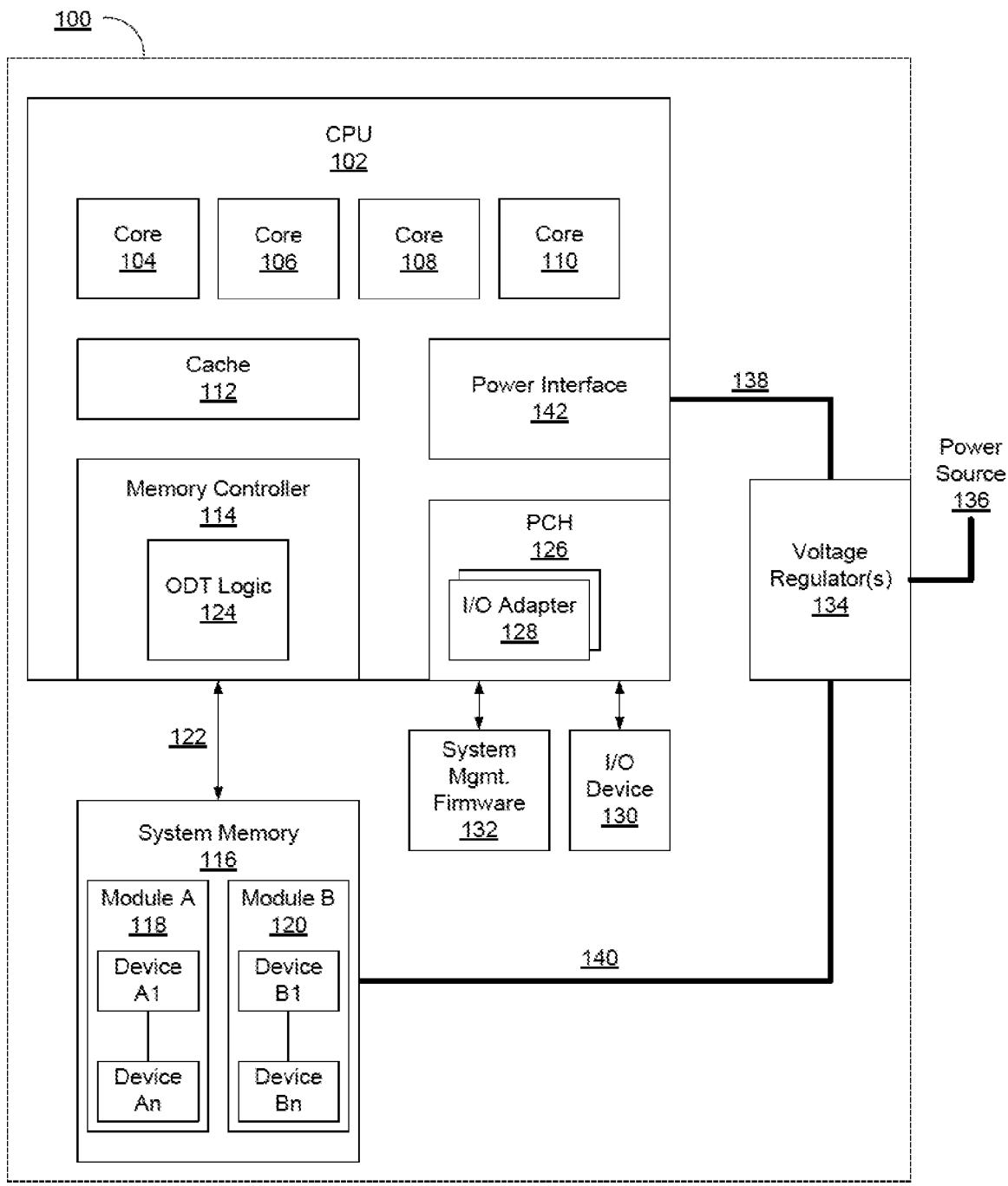
FIG. 1 illustrates an embodiment of a computer system capable of reducing power delivery noise on a memory channel.

FIG. 1 illustrates an embodiment of a computer system capable of reducing power delivery noise on a memory channel.

Computer system 100 is shown. The computer system may be a desktop, server, workstation, laptop, handheld, television set-top, media center, game console, integrated system (such as in a car), or other type of computer system. In several embodiments the computer system 100 includes one or more central processing units (CPUs), also referred to as "processors." Although in many embodiments there are potentially many CPUs, in the embodiment shown in FIG. 1 only CPU 102 is shown for simplicity. CPU 102 may be an Intel® Corporation CPU or a CPU of another brand. CPU 102 includes one or more cores in different embodiments. CPU 102 is shown including four cores (cores 104, 106, 108, and 110).

In many embodiments, each core includes several internal functional blocks/units/logic components. For example, core 104 may include instruction/data (i.e., Level 1, L1) caches, instruction decoders, execution units, allocation/retirement units, etc. These functional components within a core are not shown to maintain the clarity of the important elements of FIG. 1.

CPU 102 may also include one or more non-L1 caches, such as non-L1 cache 112. In many embodiments, at least one non-L1 cache, such as cache 112, is present in the CPU 102 outside of any given core. Additionally, in many embodiments, cache 112 is shared between the four cores shown. In other embodiments that are not shown, additional non-L1 caches other than cache 112 are implemented. In different embodiments cache 112 may be apportioned in different ways. Additionally, cache 112 may be one of many different sizes in different embodiments. For example, cache 112 may be an 8 megabyte (MB) cache, a 16 MB cache, etc.

In many embodiments, CPU 102 includes an integrated system memory controller 114 to provide an interface to communicate with system memory 116. In other embodiments that are not shown, memory controller 114 may be located in a discrete chip separate from CPU 102 elsewhere in computer system 100.

System memory 116 may comprise dynamic random access memory (DRAM), such as a type of double data rate (DDR) DRAM or another form of DRAM. System memory 116 may be a general purpose memory to store data and instructions to be operated upon by CPU 102. Additionally, there may be other potential devices within computer system 100 that have the capability to read and write to the system memories, such as a direct memory access (DMA)-capable I/O (input/output) device.

System memory 116 additionally may include one or more in-line memory modules, such as module A 118 and module B 120. Each of module A 118 and module B may include several DRAM memory devices (e.g. devices A1 through An and devices B1 through Bn). In some embodiments, each memory module includes an advanced memory buffer (not shown) to facilitate memory transfers to and from the devices on each respective memory module. In other embodiments, buffers facilitating memory transfers are limited to those in the memory controller 114.

The memory channel 122 (i.e., bus, interconnect, link, etc.) that couples CPU 102 with system memory 116 may include several metal transmission lines (i.e. wires/traces) that are capable of transporting data, address, control, and clock signals.

The memory controller and system memory both include driver circuitry to drive the signals across memory channel 122 to complete memory read and write data transfers. Additionally, in many embodiments on-die termination (ODT) logic 124 is present in memory controller 114. ODT logic 124 includes a termination resistor tied to a given transmission line on the link 124 to provide impedance matching for proper line termination, which helps prevent reflections on the transmission line. In many embodiments, ODT logic 124 includes dynamic termination values that are capable of changing depending on the type of transfer on the transmission lines (i.e., read vs. write). Dynamic ODT logic 124 details are discussed below in regard to FIG. 2.

Platform controller hub (PCH) 126 (e.g., a complex of I/O controllers and other circuitry) includes an I/O interface that enables communication between the CPU 102 and external I/O devices. The complex may include one or more I/O adapters, such as I/O adapter 128. I/O adapters translate a host communication protocol utilized within the CPU 102 to a protocol compatible with a particular I/O device, such as I/O device 130. Some of the protocols that a given I/O adapter may translate include a Peripheral Component Interconnect (PCI)-Express, Universal Serial Bus (USB), Serial Advanced Technology Attachment (SATA), Small Computer System Interface (SCSI), Redundant Array of Inexpensive Disks (RAID), and 1394 "Firewire," among others. Additionally, there may be one or more wireless protocol I/O adapters. Examples of wireless protocols are Bluetooth, IEEE 802.11-based wireless protocols, and cellular protocols, among others.

In other embodiments, PCH 126 is a discrete device located externally to the CPU 102. In these embodiments, an interface such as a direct memory interface (DMI) couples the CPU to the PCH. Though, these embodiments are not shown.

Other communication interfaces generally present in CPU 102 that are not shown for sake of clarity include an inter-CPU interface to provide an interface to a link coupled to one or more additional CPUs for inter-CPU communications, a graphics interface to provide an interface to a link coupled to a discrete graphics controller, as well as potentially many other interfaces. These interfaces may include high-speed PCI-Express interfaces or other high-speed interfaces.

The computer system 100 also includes a system management firmware 132 to provide boot instructions to initialize the computer system and components. In different embodiments, system management firmware may be a basic input/ouput system (BIOS), an extendible firmware, or another form of firmware instructions the computer system may utilize during the boot of the platform.

The computer system 100 additionally includes one or more voltage regulators 134 that provide regulated power to components in the computer system 100. Each voltage regulator 134 regulates power from a power source 136 and sends the regulated power along power rails (e.g., 138 and 140) to components such as the CPU 102 and system memory 116. CPU 102 includes a power interface 140 to receive the supplied power and distribute it to the logic throughout CPU 102. System memory also includes a power interface to receive power from the power rails (potentially per in-line memory module), though this particular interface is not shown. Additional power rails may be present, such as those supplying I/O devices, though these are not shown.

This entire set of power delivery rails and components may be referred to as a power delivery network. Each power rail of the power delivery network has an associated voltage level. When the computer system is powered on, there are multiple resonant frequencies at which the voltage level provided by the power delivery network oscillates. These are typically called 1st droop (the highest frequency of resonance), 2nd droop (the 2nd highest frequency of resonance), 3rd droop (the 3rd highest resonance frequency) etc. In a typical power delivery network for the system memory, the 1st droop is the most dominant frequency. The 2nd droop, 3rd droop etc are usually much smaller in magnitude and at much lower frequencies. These resonant frequencies may be different for different computer systems, but for each power network within a given computer system it is a repeatable ebb and flow at the specific frequencies. While the invention can be scaled to address multiple resonant frequencies, for the ease of explaining the concept only the dominant resonant frequency, typically 1st droop, is shown. Each full oscillation may be referred to as a wavelength (i.e., a repeatable fluctuation cycle of the voltage) and each wavelength starts at the baseline supplied voltage level and includes a peak and a valley. The voltage level starts at the supplied voltage level, rises to the peak voltage level, falls to the low (valley) voltage level, and finally rises back to the supplied voltage level to complete the wavelength.

Figure 2:
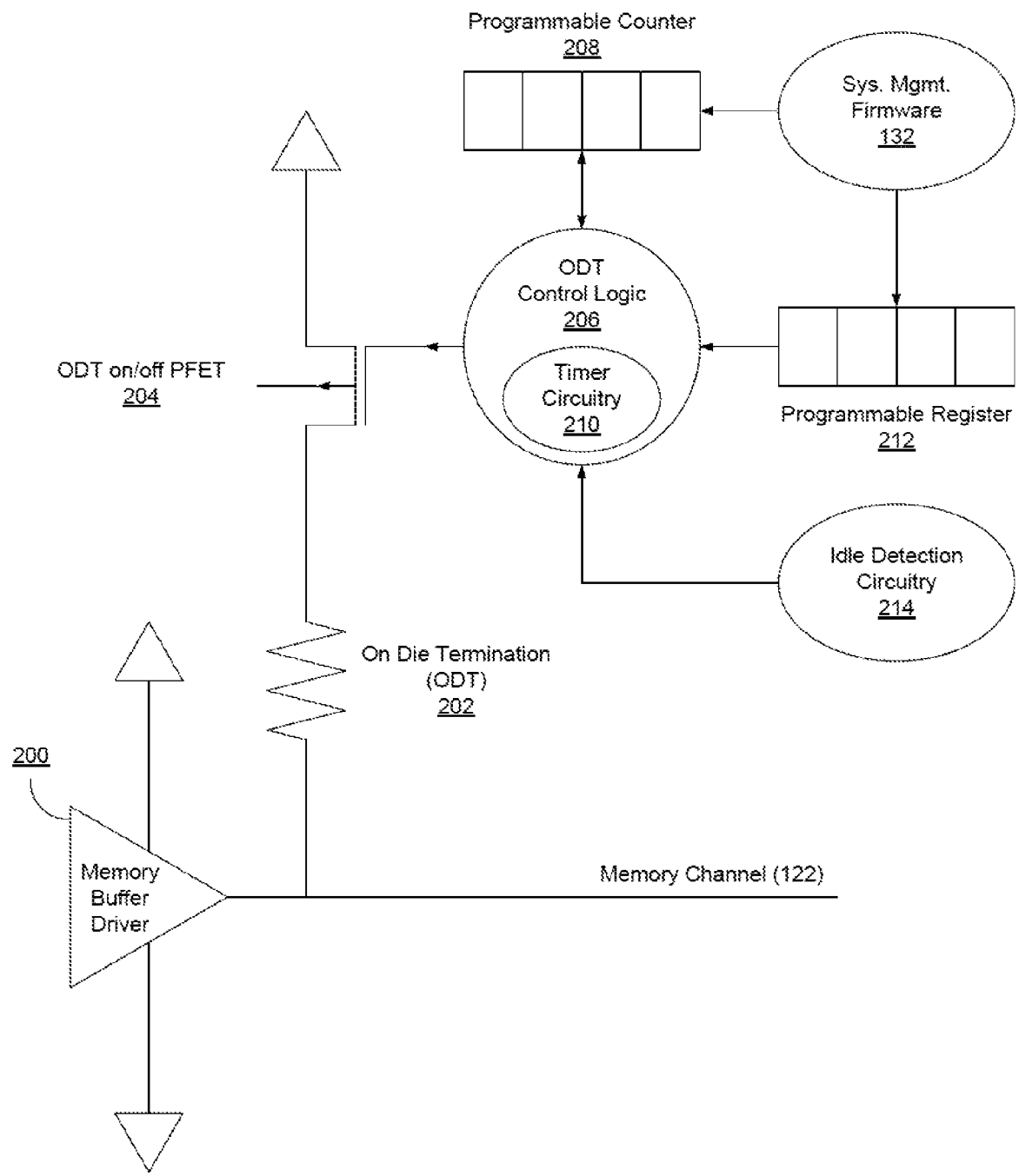
FIG. 2 illustrates a detailed view of the on-die termination logic capable of minimizing power delivery network noise.

FIG. 2 illustrates a detailed view of the on-die termination logic capable of minimizing noise on the system memory power delivery network.

In many embodiments, a memory buffer driver 200 is located in the memory controller (114 in FIG. 1). The driver 200 is powered by the power delivery network and drives signals on the memory channel 122. ODT 202 includes a resistor to modify the termination resistance on the memory channel 122. The ODT resistor 202 can be turned on or off at PFET (P-type field effect transistor) 204. When PFET 204 is turned on, the ODT resistor 202 introduces a load on the memory channel 122. When the PFET 204 is off, the ODT resistor 202 does not have an observable effect on memory channel 122.

The PFET 204 is controlled by ODT control logic 206, thus ODT control logic 206 essentially is capable of turning on or off the ODT resistor 202. In many embodiments, ODT control logic 206 utilizes the ODT resistor 202 to dampen the effect of noise on the power delivery network. Specifically, when the memory channel 122 is active (i.e., memory transfers are taking place on the memory channel), the power delivery network sources current to the channel. A small but noticeable voltage drop on the power delivery network takes place when current is being sourced. However, the moment the memory channel 122 goes into an idle state (i.e., no memory transfers are taking place on the memory channel), the channel load is released and the power delivery network will start to rebound at the resonant frequency.

Figure 3:
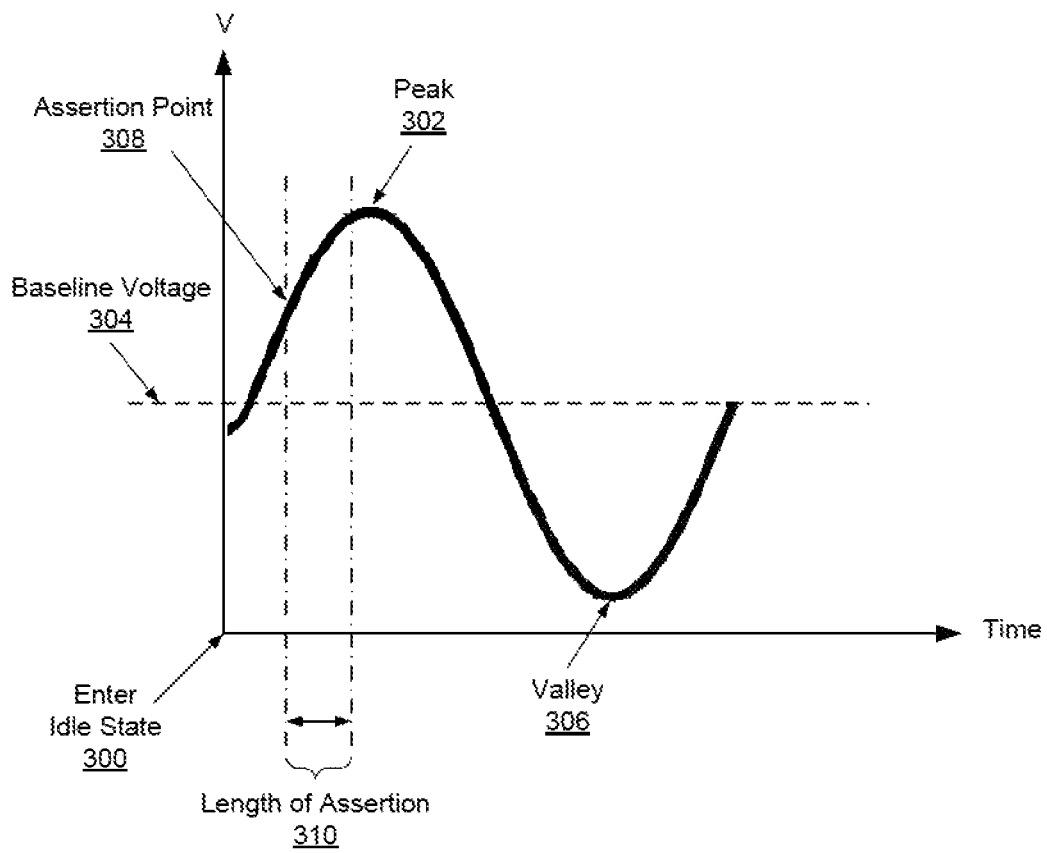
FIG. 3 illustrates an example of a resonant frequency waveform.

An example of a resonant frequency waveform is shown in FIG. 3. If left untouched, at a short period of time after the memory channel enters the idle state (time position 300), the power delivery network will reach the highest voltage level in the waveform (at peak position 302). This position corresponds to the 90 degree position in the waveform.

To combat this level of noise, the ODT control logic 204 may introduce a load on the power delivery network, which will cause the voltage level on the network to drop in the same way that the power delivery network voltage level drops during an active load on the memory channel 122 (as discussed above). This load, which may be referred to as a destructive load, will cause interference in the power delivery network's resonant waveform. When the destructive load is placed on the channel for a short period of time after the release of the active load (i.e., memory channel entering the idle state), the resonant frequency will be muted. Not only is the swing above the baseline voltage 304 muted, but as a result of the muted positive swing, a corresponding muted negative swing also may be observed due to the resonance naturally taking a similar negative magnitude swing in relationship to the positive magnitude swing.

The ODT assertion point 308 would need to take place during the rise of the voltage towards the peak voltage 302. If the assertion is delayed until the peak happens, then the assertion would be wasted since the peak noise level would have already taken place. Although having ODT resistance on for a longer period of time would maximize the muting of the noise, this resistance consumes power. Many modern day computer circuits attempt to minimize power consumption, thus a tradeoff is determined. The longer the ODT resistance is asserted, the smaller the voltage magnitude of the power delivery network's resonant frequency. On the other hand, the shorter the ODT resistance is asserted, the smaller the impact on system power consumption.

Apart from determining the correct assertion point timing on the upswing of the waveform, the ODT resistance impact would also be felt differently based on how long the resistance was asserted (i.e., length of assertion 310. The longer the resistance is asserted, the more muted the magnitude of waveform, the shorter the resistance is asserted, the less impact the ODT resistance will have on the waveform.

Additionally, in many embodiments, the ODT resistance is only turned on for the first cycle of the waveform after entering the idle state. The first cycle of the waveform generally tends to have the largest magnitude of noise. Subsequent cycles in that idle state will typically have lower magnitude due to the resistive losses in the power network. Thus, if the first cycle of the waveform is muted, the worst noise excursion will be suppressed and many times the subsequent cycles of the waveform tend to display muted magnitudes even if they do not each have the destructive load applied.

Though, in other embodiments, the ODT resistance may be turned on for the same length of time at the same point in the waveform more than one cycle of the waveform up to the extreme case where the ODT resistance is turned on for the same length of time at the same point in the waveform for every single idle cycle.

Figure 4A:
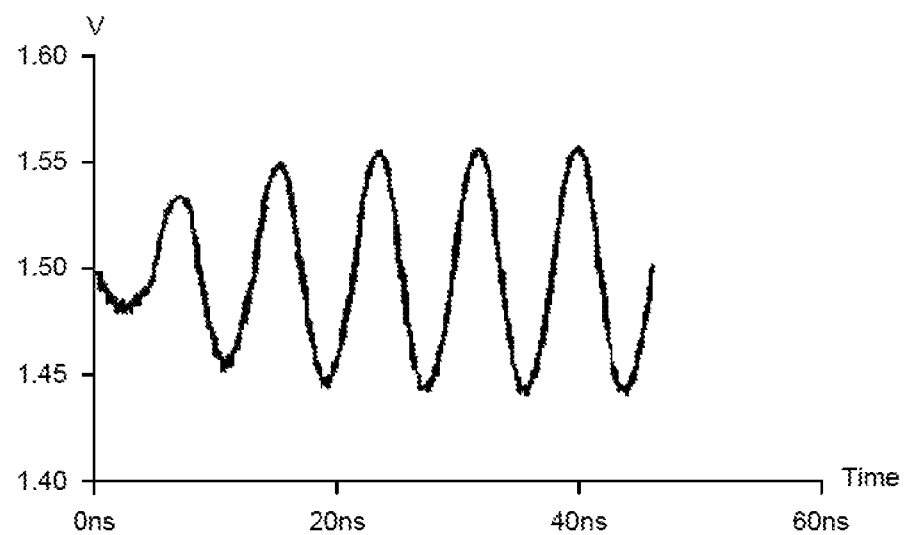
FIGS. 4A, 4B, and 4C show an actual impact of the ODT resistance on an embodiment of a power delivery network.
Figure 4B:
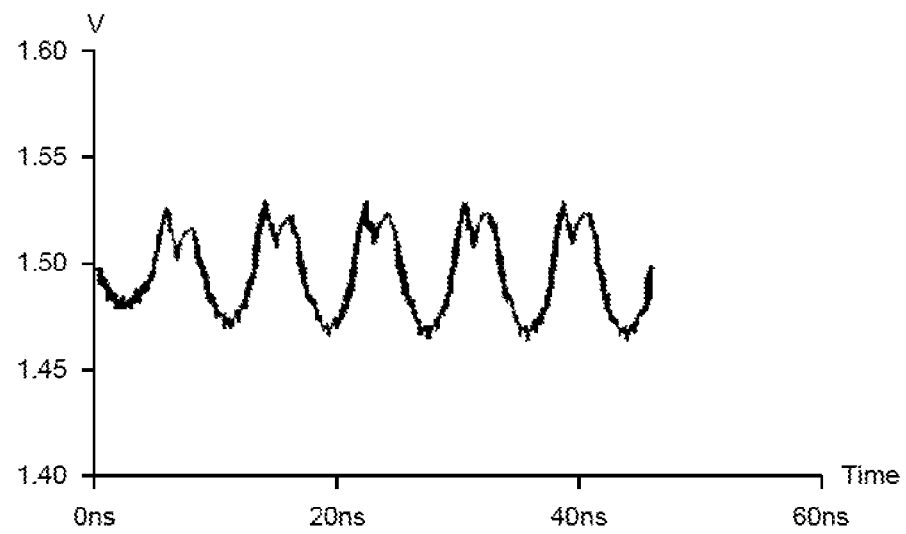
Figure 4C:
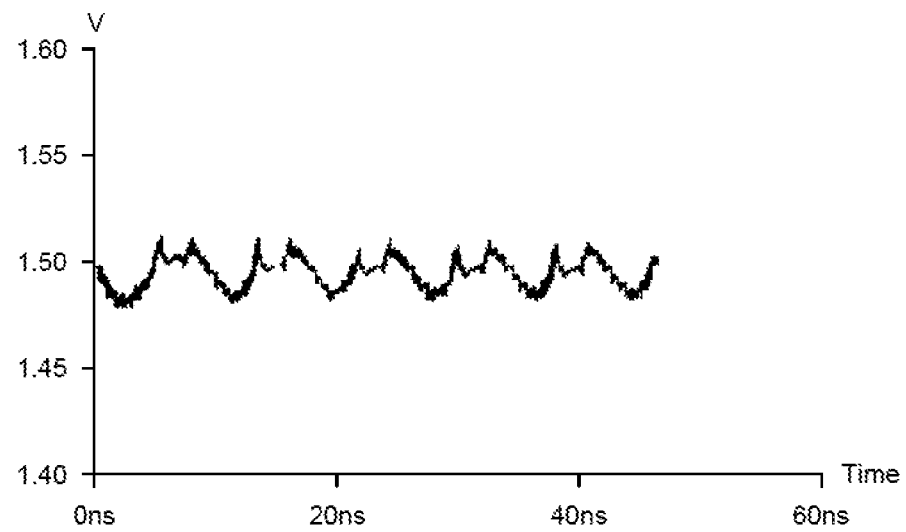

FIG. 3 provides a representative example of a single cycle of the resonant frequency waveform, but this graph does not show the actual waveform impact seen with the ODT resistance being applied. FIGS. 4A, 4B, and 4C show the actual impact of the ODT resistance on an embodiment of a power delivery network. Each of these figures show the resonant frequency in the power delivery network as the memory interface goes active-idle-active in a sequence approaching the resonant frequency of that power delivery network. In each instance immediately after a load is released on the network (i.e., the memory channel enters an idle state) the power rail starts to resonate at the resonant frequency of the network. For a network that has a baseline voltage level of 1.5V, an example of the network's resonant frequency without any destructive load utilized is shown in FIG. 4A. FIG. 4B shows the same resonant frequency waveform when the destructive load is turned on for one memory channel clock cycle at the second clock cycle after the idle state is entered. FIG. 4C shows the same resonant frequency waveform when the destructive load is turned on for three memory channel clock cycles starting at the second clock cycle after the idle state is entered.

Returning to FIG. 2, to implement a tunable destructive load that allows for changing the assertion point as well as the length of the assertion, additional logic is implemented.

First, a programmable counter 208 is implemented to signify the number of clock cycles after the idle state is entered at which the destructive load is asserted using the ODT resistance 202. For example, in some embodiments, the programmable counter 208 may be a 4-bit counter and it may be programmed to a value between 0 and 15 clock cycles to wait upon entering the idle state before causing ODT control logic 206 to switch PFET 204 on, causing ODT resistor 202 to pull a load on the memory channel 122.

Timer circuitry 210 within ODT control logic 206 utilizes the programmable counter value to delay the assertion. Then once the assertion takes place, the timer circuitry resets the delay to the programmable counter 208 value for the next instance of entering the idle state.

Next, a programmable register 212 is implemented to signify the number of clock cycles to leave the destructive load asserted once the assertion takes place. For example, a value of 2 may be entered into programmable register 212. This value is read by ODT control logic 206. Logic 206 then knows to deassert the destructive load 2 clock cycles after it was asserted.

The values that are placed in the programmable counter 208 and the programmable register 212 may be placed there during system boot by logic within the system management firmware 132. The firmware may be user programmable, thus the assertion point and the length of assertion may be decided by the manufacturer of the system, a user of the system, or someone else. These values may be programmed in once or reprogrammed based on system changes/updates. Although not shown, an additional register may be implemented to instruct the ODT control logic 206 how many subsequent waveform cycles after the first idle cycle would the destructive load be asserted in a row. A default of this register may be one, since, as discussed above, a single assertion per idle entry may be sufficient to mute subsequent consecutive idle state waveform cycles.

In other embodiments that are not shown, only the programmable counter 208 is implemented and a non-modifiable assertion length is utilized.

Finally, logic, such as idle detection circuitry 214, within the computer system will notify the ODT control logic of the memory channel 122 entering an idle state. This allows the ODT control logic 206 to initiate the sequence of implementing the destructive load.

Figure 5:
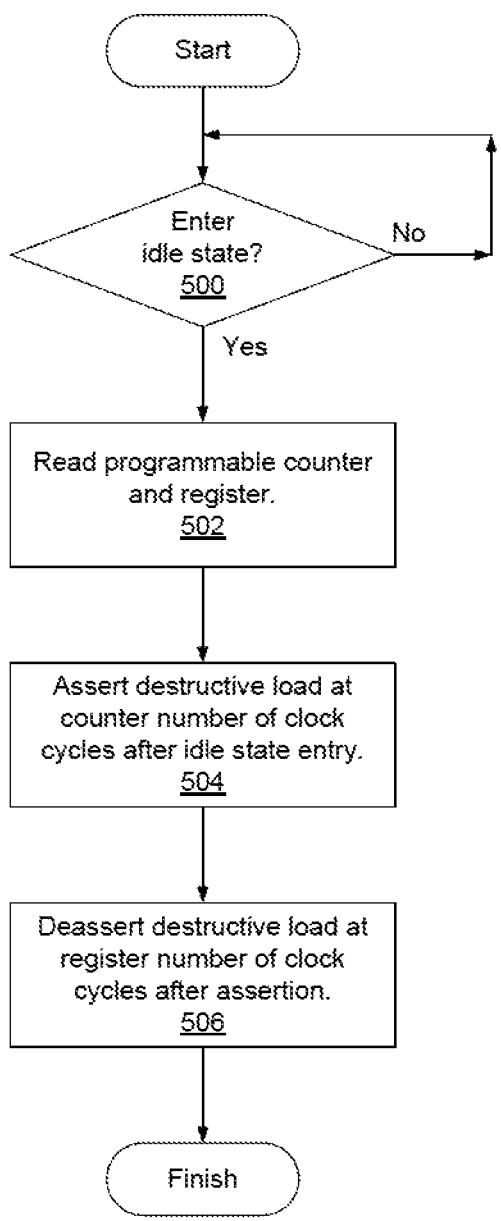
FIG. 5 is a flow diagram of an embodiment of a process capable of reducing power delivery noise on a memory channel.

FIG. 5 is a flow diagram of an embodiment of a process capable of reducing power delivery noise on a memory channel.

The process is performed by processing logic which may comprise hardware circuitry, firmware code, software applications, or a combination of any of the three types of processing logic. The process begins by processing logic determining if the memory channel has entered an idle state (processing block 500). If an idle state has not been entered then the process restarts, otherwise, if the memory channel has entered an idle state, then processing logic reads the programmable counter and register (processing block 502) to determine a number of clock cycles that need to take place prior to the assertion of the destructive load as well as the length of the assertion of the destructive load.

Next, processing logic asserts the destructive load at a number of clock cycles after the memory channel has entered the idle state, the number of clock cycles represented by the value stored in the programmable counter (processing block 504). Then processing logic deasserts the destructive load at a number of clock cycles after the assertion of the destructive load, the number of clock cycles to hold the assertion for being represented by the value stored in the programmable register (processing block 506), and the process is finished.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions.

In the description above and in the claims, the terms "include" and "comprise," along with their derivatives, may be used, and are intended to be treated as synonyms for each other. In addition, in the following description and claims, the terms "coupled" and "connected," along with their derivatives may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate, interact, or communicate with each other.

In the description above, certain terminology is used to describe embodiments of the invention. For example, the term "logic" is representative of hardware, firmware, software (or any combination thereof) to perform one or more functions. For instance, examples of "hardware" include, but are not limited to, an integrated circuit, a finite state machine, or even combinatorial logic. The integrated circuit may take the form of a processor such as a microprocessor, an application specific integrated circuit, a digital signal processor, a microcontroller, or the like.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

The invention claimed is:

1. A device, comprising:
 a memory buffer driver circuit to drive signals on a memory channel at a voltage level, the voltage level corresponding to an amount of voltage supplied to the memory buffer driver circuit from a rail of a power delivery network, wherein the voltage level exhibits a repeatable fluctuation cycle at a resonant frequency of the power delivery network; and
 an on-die termination logic circuit coupled to the memory channel, the on-die termination logic circuit, in response to the memory channel being in an idle state, to:
  assert a first termination resistance on the memory channel at a first point in time when the voltage level is rising towards a peak in the repeatable fluctuation cycle; and
  deassert the first termination resistance on the memory channel at a second point in time subsequent to the assertion and prior to the voltage level reaching a low in the repeatable fluctuation cycle that immediately follows the peak.

2. The device of claim 1, further comprising:
 idle detection circuitry to determine when the memory channel enters an idle state, the idle state being entered when the power delivery network transitions from sourcing current to the memory channel to not sourcing current to the memory channel.

3. The device of claim 2, wherein the on-die termination logic circuit further comprises:
 a programmable counter, the programmable counter at least storing a starting counter value corresponding to a number of memory channel clock cycles transpiring between the idle state being entered and the first point in time;
 timer circuitry to start the programmable counter in response to the idle detection circuitry detecting the memory channel entering the idle state; and
 the on-die termination logic circuit to assert the first termination resistance at the expiration of the programmable counter.

4. The device of claim 3, further comprising:
 a programmable register, the programmable register at least storing an assertion count value corresponding to a number of memory channel clock cycles transpiring between the assertion of the first termination resistance and the subsequent deassertion of the first termination resistance;
 wherein the on-die termination logic circuit to maintain the assertion of the first termination resistance for a number of memory channel clock cycles equal to the assertion count value.

5. The device of claim 3, wherein the programmable counter is capable of being programmed with the starting counter value at boot by a system management firmware.

6. The device of claim 1, wherein the peak in the repeatable fluctuation cycle is approximately a quarter of a full wavelength of the power delivery network resonant frequency.

7. The device of claim 1, wherein the on-die termination logic circuit is further operable to:
 repeat the assertion of the first termination resistance for at least one additional wavelength of the power delivery network resonant frequency; and
 repeat the deassertion of the first termination resistance for each additional repeated assertion.

8. A computer system, comprising:
 a power delivery network to deliver power to a plurality of components in the computer system at least at a first voltage level, the power delivery network including at least a first power rail, wherein the first voltage level exhibits a repeatable fluctuation cycle at a resonant frequency of the power delivery network;
 a memory module including one or more dynamic random access memory devices;
 a memory channel to couple the memory module to a memory controller; and
 the memory controller, wherein the memory controller includes:
  a memory buffer driver circuit powered by the power delivery network, the memory buffer circuit to drive signals on the memory channel at the first voltage level; and
  an on-die termination logic circuit coupled to the memory channel, the on-die termination logic circuit, in response to the memory channel being in an idle state, to:
   assert a first termination resistance on the memory channel at a first point in time when the first voltage level is rising towards a peak in the repeatable fluctuation cycle; and
   deassert the first termination resistance on the memory channel at a second point in time subsequent to the assertion and prior to the first voltage level reaching a low in the repeatable fluctuation cycle that immediately follows the peak.

9. The computer system of claim 8, wherein the memory controller further comprises:
idle detection circuitry to determine when the memory channel enters an idle state, the idle state being entered when the power delivery network transitions from sourcing current to the memory channel to not sourcing current to the memory channel.

10. The computer system of claim 9, wherein the on-die termination logic circuit further comprises:
a programmable counter, the programmable counter at least storing a starting counter value corresponding to a number of memory channel clock cycles transpiring between the idle state being entered and the first point in time;
timer circuitry to start the programmable counter in response to the idle detection circuitry detecting the memory channel entering the idle state; and
the on-die termination logic circuit to assert the first termination resistance at the expiration of the programmable counter.

11. The computer system of claim 10, further comprising:
a programmable register, the programmable register at least storing an assertion count value corresponding to a number of memory channel clock cycles transpiring between the assertion of the first termination resistance and the subsequent deassertion of the first termination resistance;
wherein the on-die termination logic circuit to maintain the assertion of the first termination resistance for a number of memory channel clock cycles equal to the assertion count value.

12. The computer system of claim 11, further comprising:
a system management firmware to, at a boot of the computer system, program the starting counter value into the programmable counter and program the assertion count value into the programmable register.

13. The computer system of claim 8, wherein the peak in the repeatable fluctuation cycle is approximately a quarter of a full wavelength of the power delivery network resonant frequency.

14. The computer system of claim 8, wherein the on-die termination logic circuit is further operable to:
repeat the assertion of the first termination resistance for at least one additional wavelength of the power delivery network resonant frequency; and
repeat the deassertion of the first termination resistance for each additional repeated assertion.

15. A method, comprising:
driving signals on a memory channel at a voltage level, the voltage level corresponding to an amount of voltage supplied to the memory buffer driver circuit from a rail of a power delivery network, wherein the voltage level exhibits a repeatable fluctuation cycle at a resonant frequency of the power delivery network; and
asserting a first termination resistance on the memory channel at a first point in time when the voltage level is rising towards a peak in the repeatable fluctuation cycle; and
deasserting the first termination resistance on the memory channel at a second point in time subsequent to the assertion and prior to the voltage level reaching a low in the repeatable fluctuation cycle that immediately follows the peak.

16. The method of claim 15, further comprising:
determining when the memory channel enters an idle state, the idle state being entered when the power delivery network transitions from sourcing current to the memory channel to not sourcing current to the memory channel.

17. The method of claim 16, further comprising:
storing a starting counter value corresponding to a number of memory channel clock cycles transpiring between the idle state being entered and the first point in time;
starting the programmable counter in response to the detecting the memory channel entering the idle state; and
asserting the first termination resistance at the expiration of the programmable counter.

18. The method of claim 17, further comprising:
storing an assertion count value corresponding to a number of memory channel clock cycles transpiring between the assertion of the first termination resistance and the subsequent deassertion of the first termination resistance;
wherein the assertion of the first termination resistance is maintained for a number of memory channel clock cycles equal to the assertion count value.

19. The method of claim 15, wherein the peak in the repeatable fluctuation cycle is approximately a quarter of a full wavelength of the power delivery network resonant frequency.

20. The method of claim 15, further comprising:
repeating the assertion of the first termination resistance for at least one additional wavelength of the power delivery network resonant frequency; and
repeating the deassertion of the first termination resistance for each additional repeated assertion.

* * * * *

UNITED STATES PATENT AND TRADEMARK OFFICE
CERTIFICATE OF CORRECTION

PATENT NO.        : 8,806,233 B2
APPLICATION NO.   : 12/971778
DATED             : August 12, 2014
INVENTOR(S)       : Sanjiv Soman It is certified that error appears in the above-identified patent and that said Letters Patent is hereby corrected as shown below:

In the Claims

Claim 4, column 8
Line 24 reads "wherein the on-die termination logic circuit to maintain" should read -- wherein the on-die termination logic circuit is to maintain --

Claim 11, column 9
Line 31 reads "wherein the on-die termination logic circuit to maintain" should read -- wherein the on-die termination logic circuit is to maintain --

Signed and Sealed this
Second Day of June, 2015

Michelle K. Lee
*Director of the United States Patent and Trademark Office*